(12) United States Patent
Yamazaki

(10) Patent No.: US 6,350,701 B1
(45) Date of Patent: Feb. 26, 2002

(54) ETCHING SYSTEM

(75) Inventor: Shunpei Yamazaki, Tokyo (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 0 days.

(21) Appl. No.: 09/408,135

(22) Filed: Sep. 29, 1999

Related U.S. Application Data

(63) Continuation of application No. 08/688,019, filed on Jul. 29, 1996, now Pat. No. 6,099,687.

(30) Foreign Application Priority Data

Jul. 29, 1995 (JP) ............................................. 7-212536

(51) Int. Cl.$^7$ .............................................. H01L 21/00
(52) U.S. Cl. ...................... 438/732; 156/345; 216/67; 216/70; 438/438; 438/729
(58) Field of Search .............. 216/67, 70, 79; 156/345 P, 345 ME, 345 MG; 438/728, 729, 732

(56) References Cited

U.S. PATENT DOCUMENTS

| | | | | |
|---|---|---|---|---|
| 4,963,242 A | * | 10/1990 | Sato et al. | 204/298.31 |
| 5,215,619 A | * | 6/1993 | Cheg et al. | 216/67 X |
| 5,330,606 A | * | 7/1994 | Kubota et al. | 156/345 |
| 5,332,880 A | * | 7/1994 | Kubota et al. | 216/67 X |

* cited by examiner

Primary Examiner—William A. Powell
(74) Attorney, Agent, or Firm—Fish & Richardson P.C.

(57) ABSTRACT

A small, light-weight and highly maintainable etching system and an etching method for etching a large substrate with a homogeneous etching rate are provided. The etching system comprises an agitating electric field system disposed around the substrate, an agitating power source of high frequency, medium frequency or low frequency, agitating electrodes, amplifiers and a phase controller to agitate electrons or ions to increase the etching speed and the uniformity of the etching rate by promoting activation of reactive gas and uniformalizing a plasma density.

18 Claims, 8 Drawing Sheets

ETCHING SYSTEM

This is a continuation of U.S. application Ser. No. 08/688,019, filed Jul. 29, 1996, now U.S. Pat. No. 6,099,687.

BACKGROUND OF THE INVENTION

The present invention relates to an etching system and an etching method for dry-etching a semiconductor film and an insulating film.

DESCRIPTION OF THE RELATED ART

Dry etching is essential for the production of highly integrated semiconductor integrated circuits and there are etching methods and etching systems utilizing reactive ion etching (RIE), magnetron enhanced RIE, electron cyclotron resonance (ECR) and the like.

FIG. 1 is a schematic diagram showing the principle of the magnetron enhanced RIE. Reactive gas 3 is fed into a vacuum container 1 via a gas flow controller 2 and is maintained at an adequate pressure by an exhaust flow control valve 4 and an exhaust system 5. An anode 6 and a cathode 7 are provided within the vacuum container 1. The cathode 7 also plays a role of a substrate table for supporting a substrate 8. The cathode 7 is connected to an RF generator 10 via a matching device 9 to cause RF discharge between the anode 6 and the cathode 7. Electromagnets 11 having different phases and opposing each other are disposed on the outside of the vacuum container 1 to facilitate the discharge within high vacuum.

While the etching method and etching system utilizing the magnetron enhanced RIE and electron cyclotron resonance have had no problem if the substrate has a size of about 6 inches in diameter or 6 inches square, the magnetron enhanced RIE has had a problem for a substrate having a size of 8, 10, 12 inches or more that a so-called bank of electrons is brought about, not effecting the original magnetron discharge that electrons drift and return. Accordingly, it becomes difficult to uniformalize the plasma density across the whole substrate and a bias of the plasma density is brought about. Depending on the bias, a specimen is often partially destroyed by ion damage or the like in an extreme case and a thin gate oxide film is likely to be damaged in particular. The ECR also has had a problem that the size and weight of the system cannot but be increased when substrates become large because a magnetic coil for ECR condition is used. Further, because the gas cannot be agitated within the plasma discharge and because the flow of the gas fed/exhausted into/from the plasma discharge must be controlled in high precision, a marked high precision gas feeding/exhausting method has been required, thus complicating and increasing the size of the system.

SUMMARY OF THE INVENTION

The present invention provides an etching method, for improving an uniformity of plasma density across the whole surface of a substrate, for enabling an uniform etching even for a substrate of 8 inches or more and for reducing damages of a substrate caused by a bias of plasma, and a configuration which allows a size and weight of a system which realizes the above method to be reduced in an RIE type etching system by providing electrodes for applying an electric field in parallel with the surface of the substrate, beside electrodes disposed so as to apply an electric field vertically to the surface of the substrate, and by not only drifting electrons/ ions within the plasma in the direction parallel with the surface of the substrate but also by agitating only electrons or both electrons and ions by utilizing a phenomenon that although both electrons and ions move following a low frequency electric field when it is applied in parallel with the surface of the substrate, electrons can follow an RF electric field, but not ions, when it is applied in parallel with the surface of the substrate.

The plurality of electrodes disposed vertically to the surface of the substrate are connected with function generators, amplifiers for amplifying frequency generated by the function generators and a phase controller for controlling a phase of the function generator connected to the other electrode. An activation of reactive gas may be promoted, a plasma density may be uniformalized and an etching rate and etching uniformity may be improved by providing two sets of parallel plate type electrodes orthogonally in case of four electrodes for example and by applying an RF electric field having a Lissajous waveform from the two sets of the electrodes and by agitating mainly electrons. In case when there are six electrodes, an activation of reactive gas may be promoted, a plasma density may be uniformalized and an etching rate and etching uniformity may be improved by disposing the electrodes hexagonally, by applying an RF electric field between the set of electrodes opposing each other, by applying a low frequency electric field whose phase is shifted to the other four electrodes to move electrons by the RF electric field in the direction parallel to the surface of the substrate and to move positive and negative ions by the low frequency electric field in the direction parallel to the surface of the substrate to agitate the electrons and ions. Any number of the electrodes for applying the agitating electric field in the direction parallel to the surface of the substrate may be used so long as it is more than two in theory. It is a matter of course that the number may be an even or odd number. Further, the present invention allows a small and light-weight system to be constructed without requiring a magnetic coil like the ECR.

Further, an activation of reactive gas may be promoted more effectively, a plasma density may be uniformalized and an etching rate and etching uniformity may be improved because a force for accelerating positive ions in the direction vertical to the surface of the substrate by Lorentz's force acts by applying a magnetic field in parallel with the surface of the substrate on the outside of the electrodes for applying the electric field in parallel to the surface of the substrate for agitating electrons and ions, beside accelerating positive ions in the direction vertical to the surface of the substrate by an ion sheath. The effect becomes significant especially when the magnetic field is a rotary magnetic field and the electric field parallel to the surface of the substrate has a frequency and phase which are in synchronism with the rotation of the rotary magnetic field. The present invention requires no bulky and heavy magnetic coil like those used in the ECR condition, thus allowing a small and light-weight system to be constructed.

Further, because the present invention allows the same effect of agitating gas itself to be obtained without controlling a flow of the reactive gas on the surface of the substrate precisely like the known etching system by uniformalizing the plasma density by agitating ions and electrons by the electric field or the magnetic field or the electric field+the magnetic field, there is less limit on the gas feeding and exhausting methods. Therefore, when a pump which may be mounted upward, downward, horizontally or obliquely such as a magnetic levitation type turbo pump is used, it may be mounted at a location giving a high maintainability. Further, a so-called system down time which occurs when the system causes a failure or the like may be shortened considerably. Still more, concerning to feeding of gas, the present invention requires no complicated gas feeding structure in the anode or cathode like the prior art system. It is of course needless to say that it is preferable to control the feed and exhaust of the gas precisely.

The present invention may be readily applied to a known cluster type multi-chamber or a corridor type multi-chamber. When it is applied to the multi-chamber, it is particularly effective in a semiconductor manufacturing process in which cleanliness of an interface between films is important by providing an etching chamber, an ashing chamber and a film forming chamber as the reaction chambers in the system because a film may be etched in the etching chamber by using a resist patterned by photolithography as a mask, the resist may be removed in the ashing chamber and another film may be formed on the patterned film in the film forming chamber. An adhesiveness of another film formed on a film may be improved by sputter-cleaning the surface of the patterned film after ashing and before forming the other film. Still more, a defect such as a dangling bond may be terminated by performing hydrogen annealing with heat or plasma or heat+plasma to the patterned film after ashing and before forming another film and one having no so-called hydrogen shortness can be fabricated by forming a fine film such as a nitride film after that.

As described above, an activation of reactive gas may be promoted, a plasma density may be uniformalized and an etching rate and etching uniformity may be improved by etching with a plurality of electrodes for applying an electric field in parallel to the surface of the substrate or means for applying a magnetic field in parallel to the substrate, beside the electrodes for applying an electric field vertically to the surface of the substrate. Further, because the means is small and light-weight, it is possible to reduce the size of the system. Further, the present invention allows a system having a high maintainability and requiring no complicated structure to be constructed because the gas is agitated by the electric field or the electric field+magnetic field.

The specific nature of the present invention, as well as other objects, uses and advantages thereof, will clearly appear from the description and from the accompanying drawings.

DESCRIPTION OF PREFERRED EMBODIMENTS

First Embodiment

Figure 1:
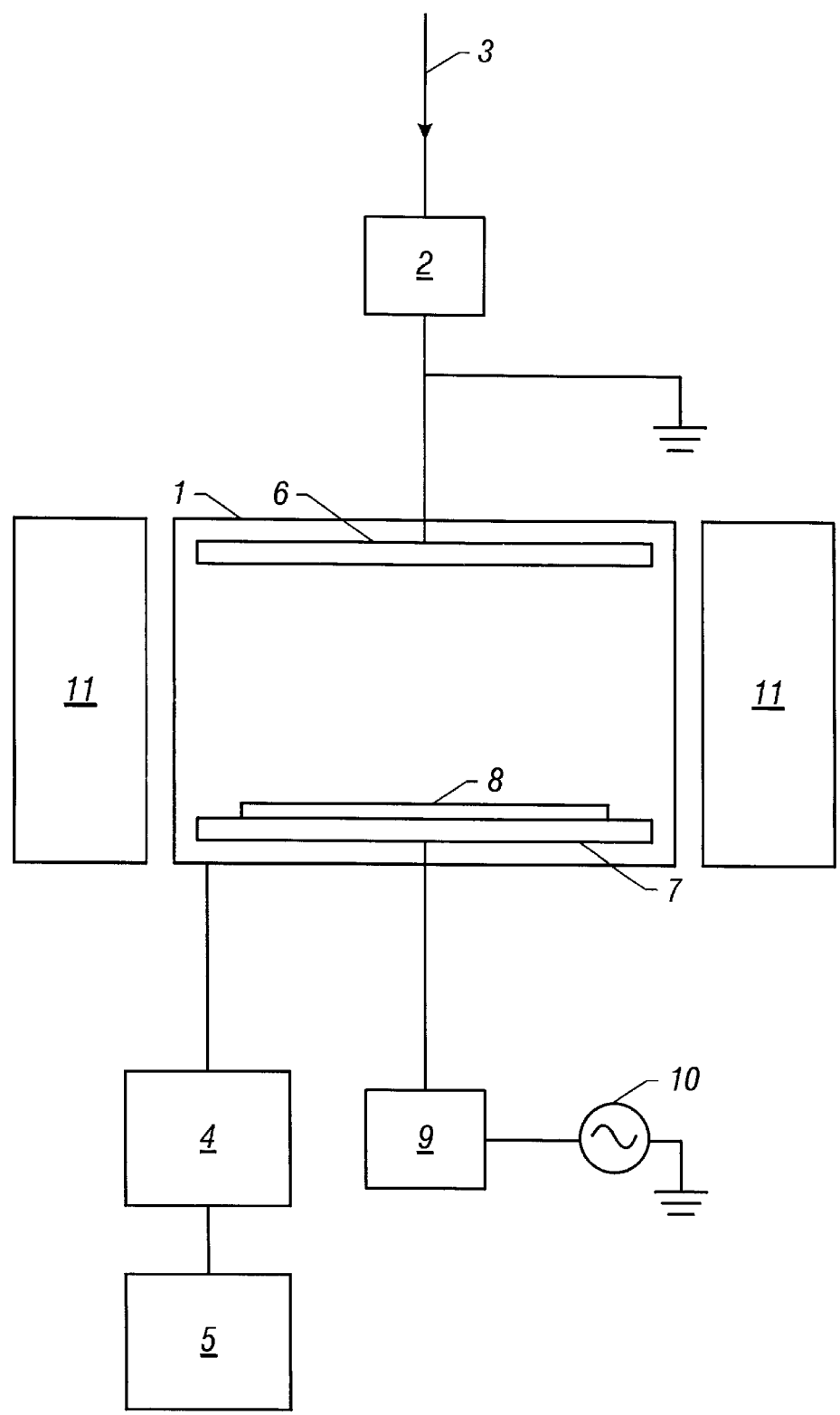
FIG. 1 is a schematic diagram showing a prior art magnetron RIE type etching system.
Figure 2:
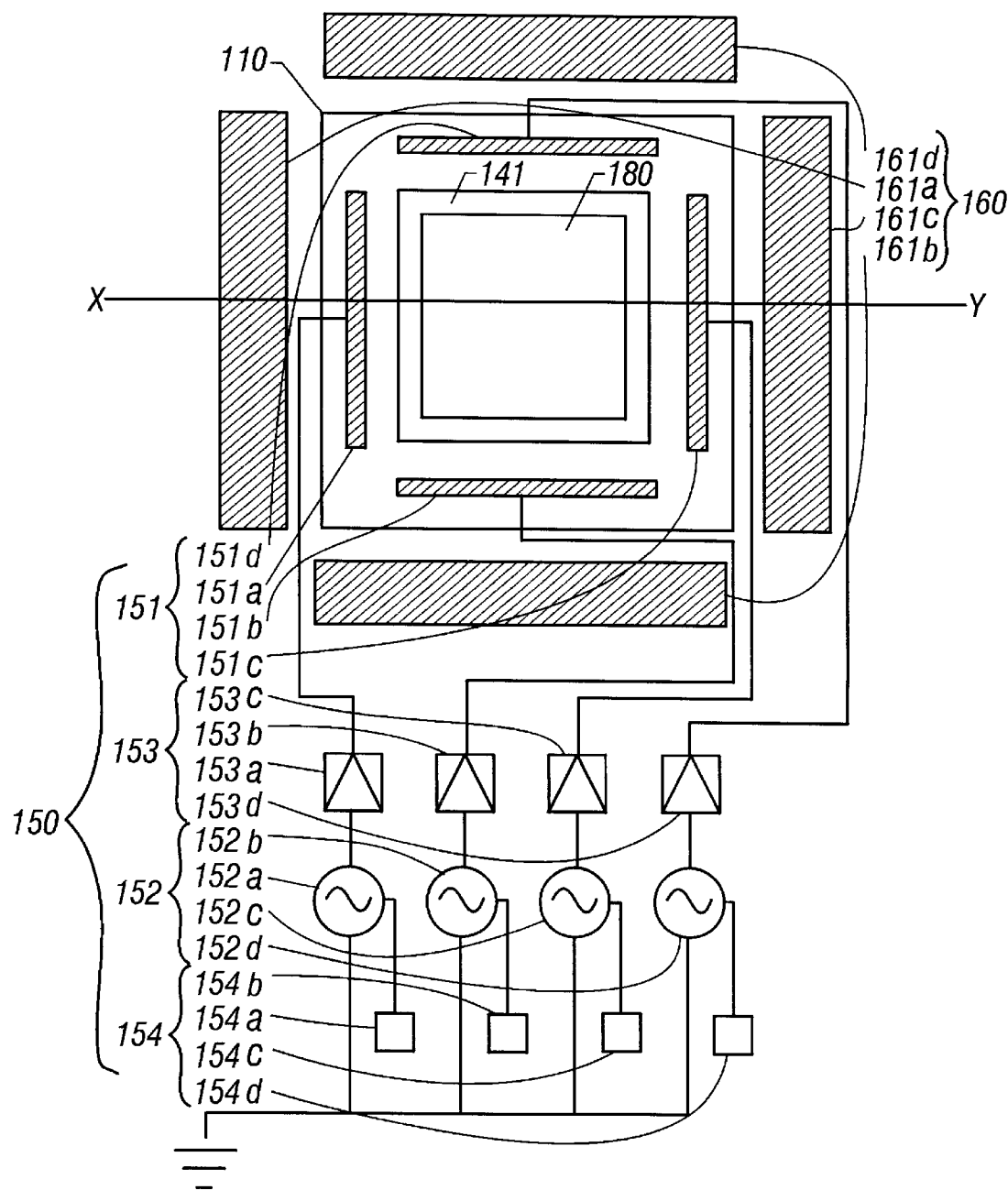
FIG. 2 is a structural diagram showing an etching system of a first embodiment of the present invention.
Figure 3:
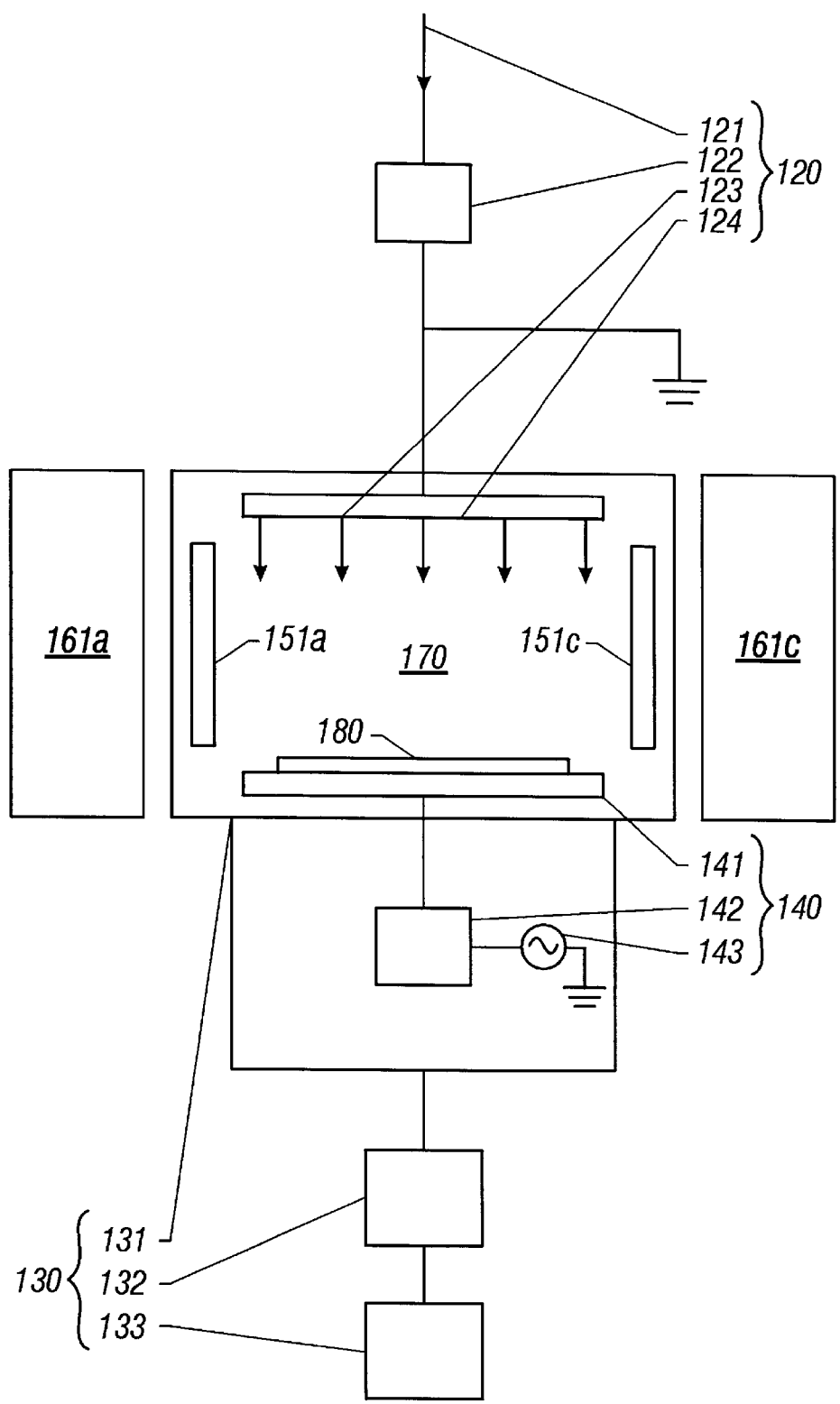
FIG. 3 is a section view along a line X-Y in FIG. 2.

FIGS. 2 and 3 show a structure of a system of the present embodiment. FIG. 3 shows a section along a line X-Y in FIG. 2. A vacuum container 110 comprises a gas feeding system 120, an exhaust system 130, an etching power source 140, an agitating electric field system 150 and an agitating magnetic field system 160.

The gas feeding system 120 has a gas feeding port 121 for feeding reactive gas via a flow controller 122. For the flow controller 122, a mass-flow controller, a needle valve or the like is used. The reactive gas which has passed the gas feeding port 121 is blown out to a reaction space 170 via gas blowout pores 123 so that it spreads homogeneously in the space. The gas is rendered to diffuse within an anode 124 where the gas blowout pores 123 exist in order to blow out the gas homogeneously.

In the exhaust system 130, exhaust ports 131 disposed around a substrate 180 so that the reactive gas fed from the gas feeding system 120 is exhausted homogeneously to flow the gas homogeneously on the surface of the substrate 180 are connected with an exhaust flow control valve 132 for maintaining the reaction space 170 at an approximately constant pressure by controlling the flow of the gas exhausted via the exhaust ports 131. For the exhaust flow control valve 132, one which can vary a conductance such as a butterfly valve, a variable orifice, a needle valve or the like is used. The exhaust flow control valve 132 is connected with an exhaust pump 133 to pull out the gas. For the exhaust pump 133, one which conforms to the very purpose thereof has to be selected considering a type of the gas used, a flow amount of the gas used, a reaction pressure, a corrosivity of the gas used, a background pressure and the like such as a turbo pump, a mechanical pump, a rotary pump, a screw pump or the like among various vacuum pumps.

In the etching power source 140, a cathode 141 which also plays a role of a supporting table of the substrate 180 is connected with a cathode power source 143 via a matching device 142. For the cathode power source 143, a high frequency power source of 13.56 MHz for example, a medium frequency power source of less than 1 MHz or a low frequency power source of less than 1 KHz is used. The purpose of the every power source is to lead ions generated in the reaction space 170 to the surface of the substrate. The agitating electric field system 150 is provided with agitating electrodes 151, i.e. four electrodes 151a, 151b, 151c and 151d in the present embodiment. Each of the agitating electrodes 151 is connected with an agitating power source 152 via an amplifier 153. While a power source in which the agitating power source 152 and the amplifier 153 are integrated may be used, the amplifier 153 is necessary in the present embodiment because a so-called function generator (frequency generator) is used to vary a frequency of the agitating power source 152 widely. For the agitating power source 152, function generators 152a, 152b, 152c and 152d are used corresponding to the respective agitating electrodes 151, i.e. the electrodes 151a, 151b, 151c and 151d. A frequency band of each of the function generators 152a through 152d was from 0 to 15 MHz. The amplifiers 153 also include amplifiers 153a, 153b, 152c and 153d corresponding to the respective electrodes 151a through 151d and the function generators 152a through 152d. A phase controller 154 for controlling a phase of each agitating power source 152 when a phase difference thereof needs to be related to each other is connected to the agitating power source 152. That is, phase shifters 154a, 154b, 154c and 154d are connected to the function generators 152a through 152d, respectively.

For the agitating magnetic field system 160, magnets 161, i.e. electromagnets 161a, 161b, 161c and 161d are used in the present embodiment.

The reactive gas fed in from the gas feeding port 121 via the flow controller 122 is diffused within the anode 124 and is led into the reaction space 170 from the gas blowout pores 123. The reactive gas reached from the reaction space 170 to the surface of the substrate 180 flows to the exhaust ports 131. The reaction space 170 is maintained at a desirable pressure by controlling a conductance of the exhaust flow control valve 132 located between the exhaust pump 133 and the exhaust ports 131.

In the present embodiment, etching uniformity and shape were compared by using substrates on which 2 $\mu$m of a-Si is formed on Corning 7059 glasses of 150 mm×150 mm×1 mm, 200 mm×200 mm×1.1 mm, 350 mm×350 mm×1.1 mm and 500 mm×500 mm×1.1 mm as the substrate 180. Mixed gas of $SF_6$ and $Cl_2$ was used as the reactive gas. The ratio of the gas was $SF_6/Cl_2$=2/8 to 10/0.

For the cathode 141, four sizes of cathodes of 200×200 mm, 250 mm×250 mm, 400 mm×400 mm and 550 mm×550 mm were used corresponding to the sizes of the substrates 180 used in the experiment. For the cathode power source 143, an RF generator of 13.56 MHz and a medium frequency power source of 500 KHz were used. The power of the power source was between 0.1 to 3 W/cm² and a distance between the cathode 141 and the anode 124 was fixed to 70 mm.

For the exhaust system 130, one having 1800 liters/s of exhaust rate was used in order to be able to regulate the reaction pressure of the vacuum container 110 of about 75 liters to 50 to 300 mTorr. A total flow amount of the gas including the reactive gas was about 500 to 2000 SCCM.

In the agitating electric field system 150, each of the phase shifters 154a through 154d were controlled so that the phase of the neighboring electrodes 151a through 151d is shifted by 90° each. The function generators 152a through 152d were operated in 1 KHz and 5 MHz. They were operated in 1 KHz to check an effect for agitating ions within a plane and 5 MHz to check an effect for agitating electrons within the plane. A power for the agitation was 0.3 to 1 W/cm².

In the agitating magnetic field system 160, static magnetic field and rotary magnetic field were generated by the electromagnets 161a through 161d so that while the field strength is 2000 gauss at the inner wall of the vacuum container 110, it is reduced exponentially toward the middle of the container, thus having about 100 gauss in maximum on the substrate 180. Although the rotary magnetic field is effective more or less as a result, the static magnetic field is also effective considerably as compared to a case without it. Accordingly, permanent magnets may be used instead of the electromagnets 161a through 161d when the static magnetic field will do, considering a size of the system and the like.

The result of the experiment shows that the etching rate and etching shape are decided almost by the condition of the etching power source 140 and the ratio of the reactive gas and that no effect of the agitating electric field system 150 and the agitating magnetic field system 160 can be seen. When typical conditions for performing anisotropic etching were $SF_6$=1000 SCCM, $Cl_2$=250 SCC M, 200 mTorr of pressure, 13.56 MHz of frequency of the cathode power source and 0.8 W/cm² of power, the etching rate of the a-Si was 6200 Å/min. in average.

However, concerning to the etching uniformity, an effect of the agitating electric field system 150 and the agitating magnetic field system 160 could be seen. Table 1 shows the effect as dispersion of the etching rates within the substrate plane.

TABLE 1

Dispersion of Etching Rates within Substrate Plane

| CONDITION | 150 mm sq. | 200 mm sq. | 350 mm sq. | 500 mm sq. |
|---|---|---|---|---|
| With AMS With AMS | ±4.0% | ±4.5% | ±5.5% | ±7.3% |
| With AMS W/O AES | ±4.0 | ±4.5 | ±5.1 | ±6.5 |
| W/O AMS With AES | ±4.0 | ±4.2 | ±4.4 | ±4.8 |
| W/O AMS With AES | ±4.0 | ±4.2 | ±4.4 | ±4.5 |

AMS: Agitating Magnetic Field System
AES: Agitating Electric Field System

The data in Table 1 showing the dispersion of the etching rates within the substrate plane was obtained by controlling each of the phase shifters 154a through 154d so that the phase of the neighboring electrodes is shifted by 90° each and by setting the function generators 152a through 152d in 5 MHz in the agitating electric field system 150. No desirable result could be obtained when the frequency was 1 KHz because the chemical effect of the etching drops in the case of the mixed gas system because the type and mass of the ions differ significantly. A large effect could be obtained when a single system gas was used.

As it is apparent from the result of the experiment, the effect of the agitating electric field system 150 is large. Although no big difference can be seen with the substrate of 150 mm sq., its effect becomes remarkable when the substrate is 200 mm sq. or more. When a Si wafer of 2 inches in diameter on which MOS transistors are mounted on the whole surface of a substrate of 500 mm sq. is placed, plasma is generated by using helium gas instead of the reactive gas of the present embodiment and a number of elements of the transistor insulation-broken down was counted by taking out the substrate, the number of broken elements is only about a half when the agitating electric field system 150 exists as compared to a case without it, showing that ion damage caused by the bias of the plasma density is small.

Second Embodiment

Figure 4:
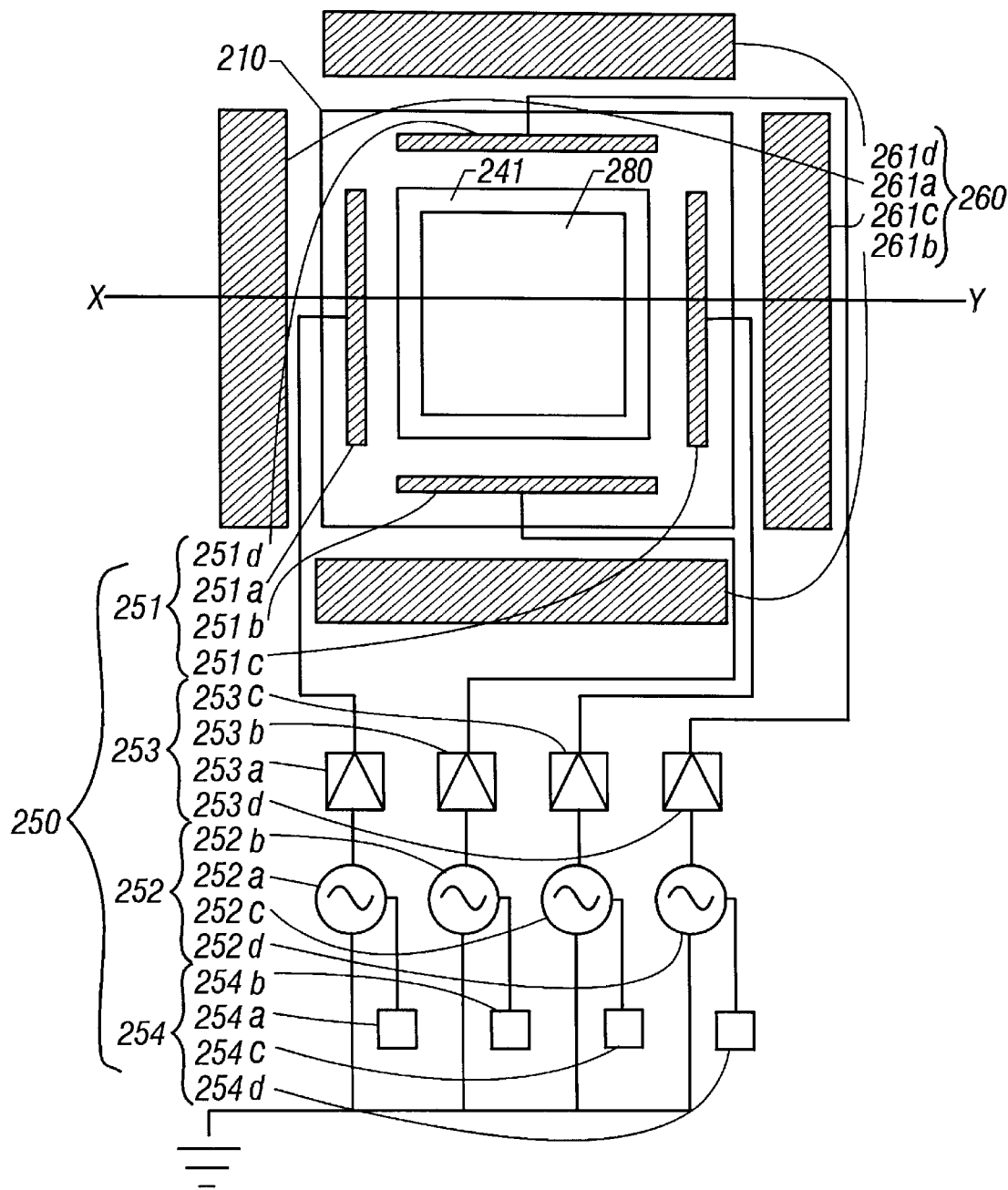
FIG. 4 is a structural diagram showing an etching system of a second embodiment of the present invention.
Figure 5:
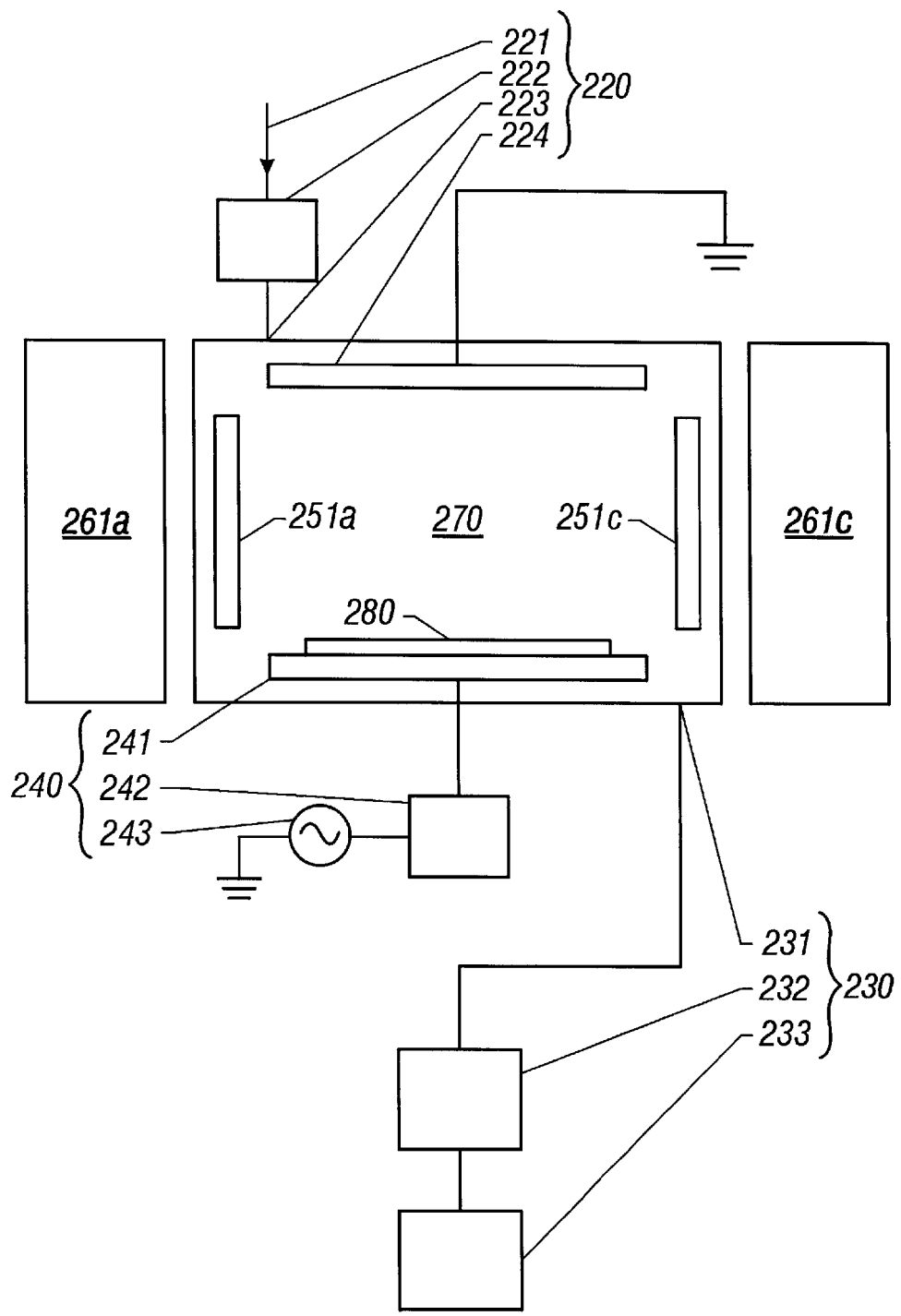
FIG. 5 is a section view along a line X-Y in FIG. 4.

While the system in which the flow of the gas is controlled precisely in the gas feeding system and the exhaust system has been used in the first embodiment, a system shown in FIGS. 4 and 5 is used in the second embodiment. FIG. 5 shows a section along a line X-Y in FIG. 4. A vacuum container 210 comprises a gas feeding system 220, an exhaust system 230, an etching power source 240, an agitating electric field system 250 and an agitating magnetic field system 260.

The gas feeding system 220 has a gas feeding port 221 for feeding reactive gas via a flow controller 222. For the flow controller 222, a mass-flow controller, a needle valve or the like is used. The reactive gas which has passed the gas feeding port 221 is blown out to a reaction space 270 via gas blowout pores 223. No particular process for blowing it out homogeneously is provided.

In the exhaust system 230, exhaust ports 231 disposed at the sides of a substrate 280 for exhausting the reactive gas fed from the gas feeding system 220 are connected with an exhaust flow control valve 232 for maintaining the reaction space 270 at an approximately constant pressure by controlling the flow of the gas exhausted via the exhaust ports 231. Although the exhaust ports can be provided around the substrate 280 so that the gas flows homogeneously on the surface of the substrate 280, the exhaust ports are not provided around the substrate 280 in this second embodiment. For the exhaust flow control valve 232, one which can vary a conductance such as a butterfly valve, a variable orifice, a needle valve or the like is used. The exhaust flow control valve 232 is connected with an exhaust pump 233 to pull out the gas. For the exhaust pump 233, one which conforms to the very purpose thereof has to be selected considering a type of the gas used, a flow amount of the gas used, a reaction pressure, a corrosivity of the gas used, a background pressure and the like such as a turbo pump, a mechanical pump, a rotary pump, a screw pump or the like among various vacuum pumps.

In the etching power source 240, a cathode 241 which also plays a role of a supporting table of the substrate 280 is connected with a cathode power source 243 via a matching device 242. For the cathode power source 243, a high frequency power source of 13.56 MHz for example, a medium frequency power source of less than 1 MHz or a low frequency power source of less than 1 KHz is used. The purpose of the every power source is to lead ions generated in the reaction space 270 to the surface of the substrate.

The agitating electric field system 250 is provided with agitating electrodes 251, i.e. four electrodes 251a, 251b, 251c and 251d in the present embodiment. Each of the agitating electrodes 251 is connected with an agitating power source 252 via an amplifier 253. While a power source in which the agitating power source 252 and the amplifier 253 are integrated may be used, the amplifier 253 is necessary in the present embodiment because a so-called function generator (frequency generator) is used to vary a frequency of the agitating power source 252 widely. For the agitating power sources 252, function generators 252a, 252b, 252c and 252d are used corresponding to the respective agitating electrodes 251, i.e. the electrodes 251a, 251b, 251c and 251d. A frequency band of each of the function generators 252a through 252d was from 0 to 15 MHz. The amplifiers 253 also include amplifiers 253a, 253b, 252c and 253d corresponding to the respective electrodes 251a through 251d and the function generators 252a through 252d. A phase controller 254 for controlling a phase of each agitating power source 252 when a phase difference thereof needs to be related to each other is connected to the agitating power source 252. That is, phase shifters 254a, 254b, 254c and 254d are connected to the function generators 252a through 252d, respectively.

For the agitating magnetic field system 260, magnets 261, i.e. electromagnets 261a, 261b, 261c and 261d are used in the present embodiment.

The reactive gas fed in from the gas feeding port 221 via the flow controller 222 is diffused within the anode 224 and is led into the reaction space 270 from the gas blowout pores 223. The reactive gas reached from the reaction space 270 to the surface of the substrate 280 flows to the exhaust ports 231. The reaction space 270 is maintained at a desirable pressure by controlling a conductance of the exhaust flow control valve 232 located between the exhaust pump 233 and the exhaust ports 231.

In the present embodiment, etching uniformity and shape were compared by using substrates on which 2 $\mu$m of a-Si is formed on Corning 7059 glasses of 150 mm×150 mm×1 mm, 200 mm×200 mm×1.1 mm, 350 mm×350 mm×1.1 mm and 500 mm×500 mm×1.1 mm as the substrate 280. Mixed gas of $SF_6$ and $Cl_2$ was used as the gas. The ratio of the gas was $SF_6/Cl_2$=2/8 to 10/0.

For the cathode 241, four sizes of cathodes of 200×200 mm, 250 mm×250 mm, 400 mm×400 mm and 550 mm×550 mm were used corresponding to the sizes of the substrates 280 used in the experiment. For the cathode power source 243, an RF generator of 13.56 MHz and a medium frequency power source of 500 KHz were used. The power of the power source was between 0.1 to 3 $W/cm^2$ and a distance between the cathode 241 and the anode 224 was fixed to 70 mm.

For the exhaust system 230, one having 1800 liters/s of exhaust rate was used in order to be able to regulate the reaction pressure of the vacuum container 210 of about 75 liters to 50 to 300 mTorr. A total flow amount of the gas including the reactive gas was about 500 to 2000 SCCM. In the agitating electric field system 250, each of the phase shifters 254a through 254d were controlled so that the phase of the neighboring electrodes 251a through 251d is shifted by 90° each. The function generators 252a through 252d were operated in 1 KHz and 5 MHz. They were operated in 1 KHz to check an effect for agitating ions within a plane and 5 MHz to check an effect for agitating electrons within the plane. A power for the agitation was 0.3 to 1 $W/cm^2$.

In the agitating magnetic field system 260, static magnetic field and rotary magnetic field were generated by the electromagnets 261a through 261d so that while the field strength is 2000 gauss at the inner wall of the vacuum container 210, it is reduced exponentially toward the middle of the container, thus having about 100 gauss in maximum on the substrate 280. Although the rotary magnetic field is effective more or less as a result, the static magnetic field is also effective considerably as compared to a case without it. Accordingly, permanent magnets may be used instead of the electromagnets 261a through 261d when the static magnetic field will do, considering a size of the system and the like.

The result of the experiment shows that the etching rate and etching shape are decided almost by the condition of the etching power source 240 and the ratio of the reactive gas and that no effect of the agitating electric field system 250 and the agitating magnetic field system 260 can be seen. When typical conditions for performing anisotropic etching were $SF_6$=1000 SCCM, $Cl_2$=250 SCC M, 200 mTorr of pressure, 13.56 MHz of frequency of the cathode power source and 0.8 $W/cm^2$ of power, the etching rate of the a-Si was 6000 Å/min. in average.

However, concerning to the etching uniformity, an effect of the agitating electric field system 250 and the agitating magnetic field system 260 could be seen. Table 2 shows the effect as dispersion of etching rates within the substrate plane.

TABLE 2

Dispersion of Etching Rates within Substrate Plane

| CONDITION | 150 mm sq. | 200 mm sq. | 350 mm sq. | 500 mm sq. |
|---|---|---|---|---|
| With AMS With AES | ±7.0% | ±13.0% | ±24.2% | ±36.4% |
| With AMS W/O AES | ±7.0 | ±12.5 | ±21.2 | ±32.0 |
| W/O AMS With AES | ±6.9 | ±8.5 | ±11.1 | ±15.3 |
| W/O AMS With AES | ±6.9 | ±8.3 | ±10.5 | ±15.0 |

AMS: Agitating Magnetic Field System
AES: Agitating Electric Field System

The data in Table 2 showing the dispersion of the etching rates within the substrate plane was obtained by controlling each of the phase shifters 254a through 254d so that the phase of the neighboring electrodes is shifted by 90° each and by setting the function generators 252a through 252d in 5 MHz in the agitating electric field system 250. No desirable result could be obtained when the frequency was 1 KHz because the chemical effect of the etching drops in the case of the mixed gas system because the type and mass of the ions differ significantly. A large effect could be obtained when a single system gas is used.

As it is apparent from the result of the experiment, the effect of the agitating electric field system 250 is large. Although no big difference can be seen with the substrate of 150 mm sq., its effect becomes remarkable when the substrate is 200 mm sq. or more. However, although the effect of the agitating electric field is large in the case of the present embodiment in which the flow of the gas is not considered at all, the uniformity of the etching rate within the substrate exceeds ±15% within 500 mm sq. Accordingly, it is actually necessary to control how to flow the gas by a certain degree. However, it is certain that the design margin of the system is wider when there is the agitating electric field system 250 when the size of the substrate and system increases. When a Si wafer of 2 inches in diameter on which MOS transistors are mounted on the whole surface of a substrate of 500 mm sq. is placed, plasma is generated by using helium gas instead of the reactive gas of the present embodiment and a number of elements of the transistor insulation-broken down was counted by taking out the substrate, the number of broken elements is only about a half when the agitating electric field system 250 exists as compared to a case without it, showing that ion damage caused by the bias of the plasma density is small.

Third Embodiment

Figure 6:
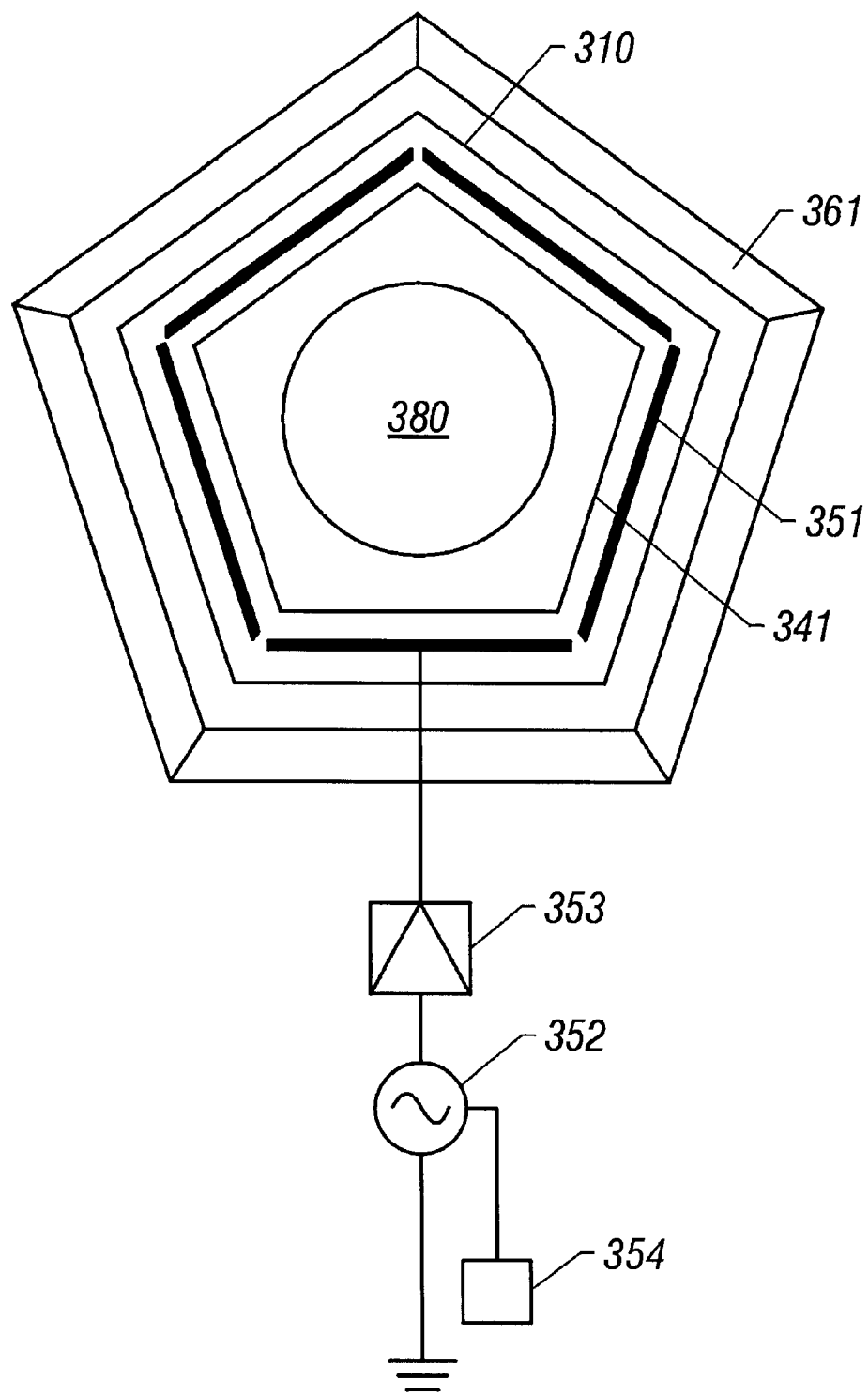
FIG. 6 is a structural diagram of an RIE type etching system of a third embodiment of the present invention.

FIG. 6 shows a third embodiment. While a vacuum container of the present embodiment is based on that of the first embodiment which is square as shown in FIG. 2, it is pentagonal in the present embodiment. A vacuum container 310 comprises an agitating electric field system and agitating magnetic field system. It also comprises an etching power source, a gas feeding system and an exhaust system similarly to the first embodiment, although not shown.

The gas feeding system has a gas feeding port for feeding reactive gas via a flow controller. For the flow controller, a mass-flow controller, a needle valve or the like is used. The reactive gas which has passed the gas feeding port is blown out to a reaction space via gas blowout pores so that it spreads homogeneously in the space. The gas is diffused within an anode where the gas blowout pores exist in order to blow it out homogeneously.

In the exhaust system, exhaust ports disposed around a substrate for exhausting the reactive gas fed from the gas feeding system homogeneously to flow the gas homogeneously on the surface of the substrate are connected with an exhaust flow control valve for maintaining the reaction space at an approximately constant pressure by controlling the flow of the gas exhausted via the exhaust ports. For the exhaust flow control valve, one which can vary a conductance such as a butterfly valve, a variable orifice, a needle valve or the like is used. The exhaust flow control valve is connected with an exhaust pump to pull out the gas. For the exhaust pump, one which conforms to the very purpose thereof has to be selected considering a type of the gas used, a flow amount of the gas used, a reaction pressure, a corrosivity of the gas used, a background pressure and the like such as a turbo pump, a mechanical pump, a rotary pump, a screw pump or the like among various vacuum pumps.

In the etching power source a cathode 341 which also plays a role of a supporting table of the substrate 380 is connected with a cathode power source via a matching device. For the cathode power source a high frequency power source of 13.56 MHz for example, a medium frequency power source of less than 1 MHz or a low frequency power source of less than 1 KHz is used. The purpose of the every power source is to lead ions generated in the reaction space to the surface of the substrate.

The agitating electric field system is provided with five agitating electrodes 351 in the present embodiment. The agitating electrodes 351 are connected with an agitating power source 352 via an amplifier 353 (although only one set is shown in the figure, all of the five electrodes are connected with them). While a power source in which the agitating power source 352 and the amplifier 353 are integrated may be used, the amplifier 353 is necessary in the present embodiment because a so-called function generator (frequency generator) is used to vary a frequency of the agitating power source 352 widely. For the agitating power sources 352, function generators are used corresponding to the respective agitating electrodes 351. A frequency band of each function generator was from 0 to 15 MHz. A phase controller 354 for controlling a phase of each agitating power source 352 when a phase difference thereof needs to be related to each other is connected to the agitating power source 352.

For the agitating magnetic field system five magnets 361 are used as shown in figure in the present embodiment.

The reactive gas fed in from the gas feeding port via the flow controller is diffused within the anode and is led into the reaction space from the gas blowout pores. The reactive gas reached from the reaction space to the surface of the substrate flows to the exhaust ports. The reaction space is maintained at a desirable pressure by controlling a conductance of the exhaust flow control valve located between the exhaust pump and the exhaust ports.

In the present embodiment, etching uniformity and shape were compared by using Si wafers on which 2 $\mu$m of Al was formed and whose size were 6 inches, 8 inches and 12 inches in diameter as the substrate 380. Mixed gas of $SiCl_4$, $Cl_2$ and $BCl_3$ was used as the gas. The ratio of the gas was $SiCl_4$/$Cl_2$/$BCl_3$=1/1/4 to 3/1/15.

For the cathode 341, three cathodes of 180 mm, 230 mm and 350 mm in diameter were used corresponding to the sizes of the substrates 380 used in the experiment. For the cathode power source an RF generator of 13.56 MHz and a medium frequency power source of 500 KHz were used. The power of the power source was between 0.1 to 3 W/cm$^2$ and a distance between the cathode 341 and the anode 324 was fixed to 70 mm.

For the exhaust system one having 1800 liters/s of exhaust rate was used in order to be able to regulate the reaction pressure of the vacuum container 310 of about 50 liters to 50 to 300 mTorr. A total flow amount of the gas including the reactive gas was about 500 to 2000 SCCM.

As for the agitating electric field, each of the phase controllers 354 were controlled so that the phases of the neighboring electrodes are shifted by 72° each. The function generators were operated in 1 KHz and 5 MHz. They were operated in 1 KHz to check an effect for agitating ions within a plane and 5 MHz to check an effect for agitating electrons within the plane. A power for the agitation was 0.03 to 1 W/cm$^2$.

As for the agitating magnetic field, static magnetic field and rotary magnetic field were generated by the electromagnets 361 so that while the field strength is 2000 gauss at the inner wall of the vacuum container 310, it is reduced exponentially toward the middle of the container, thus having about 100 gauss in maximum on the substrate 380. Although the rotary magnetic field is effective more or less as a result, the static magnetic field is also effective considerably as compared to a case without it. Accordingly, permanent magnets may be used instead of the electromagnets when the static magnetic field will do, considering a size of the system and the like.

The result of the experiment shows that the etching rate and etching shape are decided almost by the condition of the etching power source and the ratio of the reactive gas and that no effect of the agitating electric field system and the agitating magnetic field system can be seen. When typical conditions for performing anisotropic etching were $SiCl_4$= 80 SCCM, $Cl_2$=80 SCCM, $BCl_3$=720 SCCM, 100 mTorr of pressure, 13.56 MHz of frequency of the cathode power source and 0.8 W/cm² of power, the etching rate of Al was 5000 Å/min. in average.

However, concerning to the etching uniformity, an effect of the agitating electric field system and the agitating magnetic field system could be seen. Table 3 shows the effect as dispersion of etching rates within the substrate plane.

TABLE 3

Dispersion of Etching Rates within Substrate Plane

| CONDITION | 6 inches φ | 8 inches φ | 12 inches φ |
|---|---|---|---|
| With AMS W/O AES | ±3.5% | ±4.3% | ±7.6% |
| With AMS W/O AES | ±3.5 | ±4.1 | ±7.4 |
| W/O AMS With AES | ±3.4 | ±3.6 | ±4.8 |
| W/O AMS With AES | ±3.4 | ±3.5 | ±4.5 |

AMS: Agitating Magnetic Field System
AES: Agitating Electric Field System

The data in Table 3 was obtained by controlling each of the phase shifters so that the phase of the neighboring electrodes is shifted by 72° each and by setting the function generators in 5 MHz for the agitating electric field system. A power of the agitating power source 352 was 0.5 W/cm². No desirable result could be obtained when the frequency was 1 KHz because the chemical effect of the etching drops in the case of the mixed gas system because the type and mass of the ions differ significantly. A large effect could be obtained when a single system gas is used.

As it is apparent from the result of the experiment, the effect of the agitating electric field system is large. Although no big difference can be seen with the substrate of 6 inches in diameter, its effect becomes remarkable when the substrate is 8 inches in diameter or more. When a Si wafer on which MOS transistors are mounted on the whole surface of a substrate of 12 inches in diameter is placed, plasma is generated by using helium gas instead of the reactive gas of the present embodiment and a number of elements of the transistor insulation-broken down was counted by taking out the substrate, the number of broken elements is only about a half when the agitating electric field exists as compared to a case without it, showing that ion damage caused by the bias of the plasma density is small.

As it can be understood also from the present embodiment, the agitating electric field system brings about the effect regardless of a concrete number of the agitating electrodes so long as it is plural. It was found that the effect is remarkable especially when the substrate size is 8 inches or more in diameter.

Fourth Embodiment

Figure 7:
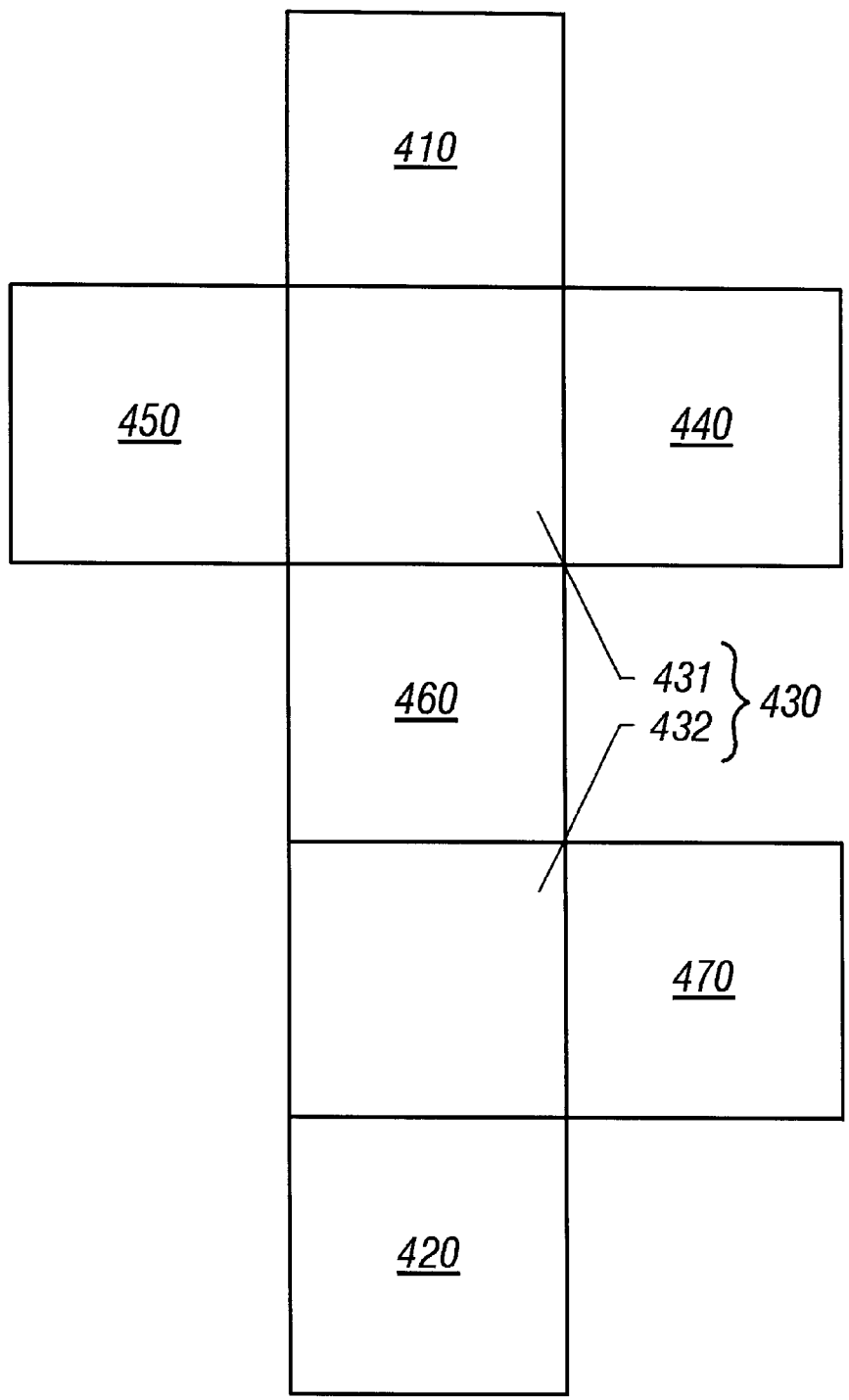
FIG. 7 is a schematic structural diagram of a multi-chamber type etching system of a fourth embodiment.

FIG. 7 shows a schematic structure of an application to a multi-chamber, wherein a basic shape of a robot chamber 430 is square.

The structure shown in FIG. 7 comprises a loading chamber 410, an unloading chamber 420, the robot chambers 430, an etching chamber 440, an ashing chamber 450, a treatment chamber 460 and film forming chamber 470. Each of the chambers is connected via a gate valve which can close/open communication with the other chamber.

In the present embodiment, a process of patterning source and drain electrodes of a bottom gate type TFT with etching stopper SiNx on a glass substrate of 500 mm sq., of performing a hydrogen treatment and of forming a-SiNx film in the end as a protecting film was carried out.

The substrate set in the loading chamber 410 was conveyed to the etching chamber 440 by a robot in the robot chamber 431. In the etching chamber 440 where there is the inventive etching system equipped with the agitating electric field system, Al which is the source and drain electrodes was etched by using the reactive gas of $SiCl_4$, $Cl_2$ and $BCl_3$. The etching conditions were set conforming to those of the third embodiment. After etching Al, n-type a-Si under Al was continuously etched by using $SF_6$ and $Cl_2$ gases and setting the conditions conforming to those of the first embodiment.

After etching, the substrate was conveyed to the ashing chamber 450 to ash and remove photoresist by oxygen plasma. Although the inventive system comprising the agitating electric field system might be used for the ashing, a normal parallel plate plasma reaction system was used because all the photoresist on the whole surface just needs to be removed.

After ashing, the substrate was conveyed to the treatment chamber 460 to perform sputter cleaning by Ar or the like when there exists residue of the photoresist or to perform plasma hydrogen treatment immediately when there is no residue. The hydrogen treatment was performed with conditions of 100 to 250° C. of substrate temperature, 200 to 800 SCCM of hydrogen and 0.2 to 0.8 W/cm² of RF power. It was effective to use the inventive agitating electric field system for the hydrogen treatment and because it was a single system gas in particular, a low frequency power source was effective to use as the agitating power source. Each of the phase shifters was controlled so that a phase of neighboring electrodes is shifted by 90° each and the function generator was operated in 1 KHz. A power of the agitating power source was 0.5 W/cm². It was also found here that it is effective to comprise the agitating electric field system also in the process other than etching.

After finishing the treatment in the treatment chamber 460, the substrate was conveyed to the film forming chamber 470 by a robot in the robot chamber 432. SiNx is formed as a protecting film in the film forming chamber 470. Forming conditions were 200 to 250° C. of substrate temperature, $SiH_4/NH_3/N_2$=1/5/20, 500 to 1500 SCCM of total flow amount and 0.5 to 1.0 W/cm² of RF power. It was also effective to use the inventive agitating electric field system in the film forming chamber 470 and the RF generator was effective as the agitating power source. Each of the phase shifters was controlled so that a phase of neighboring electrodes is shifted by 90° each and the function generator was operated in 5 MHz. A power of the agitating power source was 0.5 W/cm². It was also found here that it is effective to comprise the agitating electric field system also in the process other than etching. The substrate was conveyed to the unloading chamber 420 after forming the film.

Fifth Embodiment

Figure 8:
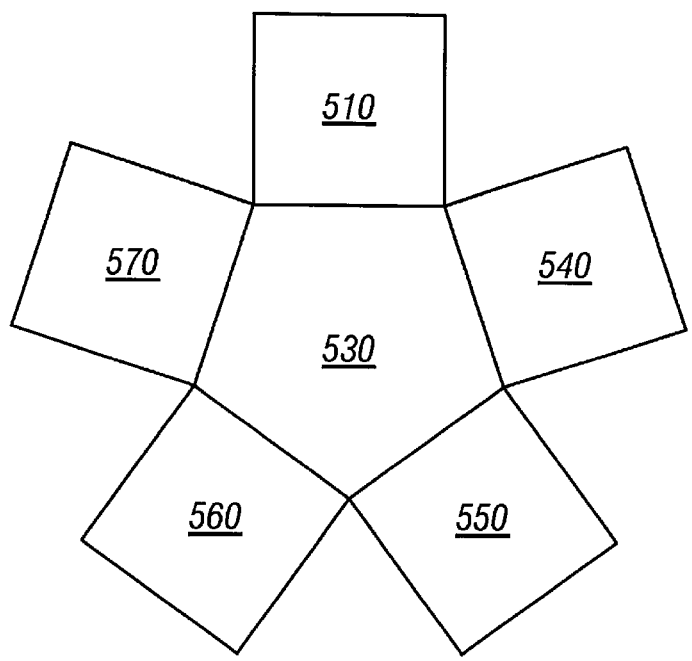
FIG. 8 is a schematic structural diagram of a multi-chamber type etching system of a fifth embodiment.

FIG. 8 shows a schematic structure of an application to a multi-chamber, wherein a basic shape of a robot chamber 530 is pentagonal. It comprises a loading and unloading chamber 510, the robot chambers 530, an etching chamber 540, an ashing chamber 550, a treatment chamber 560 and film forming chamber 570. Each of the chambers is connected via a gate valve which can close/open communication with the other chamber.

In the present embodiment, a process of patterning top wires on a Si wafer of 12 inches in diameter having a laminated structure, of performing a surface treatment and of forming an a-SiOx film as a protecting film in the end was carried out.

The substrate set in the loading and unloading chamber 510 was conveyed to the etching chamber 540 by a robot in the robot chamber 530. In the etching chamber 540 where there is the inventive etching system equipped with the agitating electric field system, Al which is the wired electrode was etched by using the reactive gas of $SiCl_4$, $Cl_2$ and $BCl_3$. The etching conditions were set conforming to those of the third embodiment.

After etching, the substrate was conveyed to the ashing chamber 550 to ash and remove photoresist by oxygen plasma. Although the inventive system comprising the agitating electric field system might be used for the ashing, a normal parallel plate plasma reaction system was used because all the photoresist on the whole surface just needs to be removed.

After ashing, the substrate was conveyed to the treatment chamber 560 to perform sputter cleaning by Ar or the like when there exists residue of the photoresist or to perform plasma hydrogen treatment immediately when there is no residue. The hydrogen treatment was performed with conditions of 100 to 250° C. of substrate temperature, 200 to 800 SCCM of hydrogen and 0.2 to 0.8 W/cm² of RF power. It was effective to use the inventive agitating electric field system for the hydrogen treatment and because it was a single system gas in particular, a low frequency power source was effective to use as the agitating power source. Each of the phase shifters was controlled so that a phase of neighboring electrodes is shifted by 72° each and the function generator was operated in 1 KHz. A power of the agitating power source was 0.5 W/cm2. It was found here that it is effective to comprise the agitating electric field system also in the process other than etching.

After finishing the treatment in the treatment chamber 560, the substrate was conveyed to the film forming chamber 570 by a robot in the robot chamber 530. SiOx is formed as a protecting film in the film forming chamber 570. Forming conditions were 200 to 250° C. of substrate temperature, $TEOS/O_2=1/10$, 500 to 1500 SCCM of total flow amount and 0.5 to 1.0 W/cm² of RF power. It was also effective to use the inventive agitating electric field system in the film forming chamber 570 and the RF generator was effective as the agitating power source. Each of the phase shifters was controlled so that a phase of neighboring electrodes is shifted by 72° each and the function generator was operated in 5 MHz. A power of the agitating power source was 0.5 W/cm². It was found here that it is effective to comprise the agitating electric field system also in the process other than etching. The substrate was conveyed to the unloading chamber 520 after forming the film.

Sixth Embodiment

Figure 9:
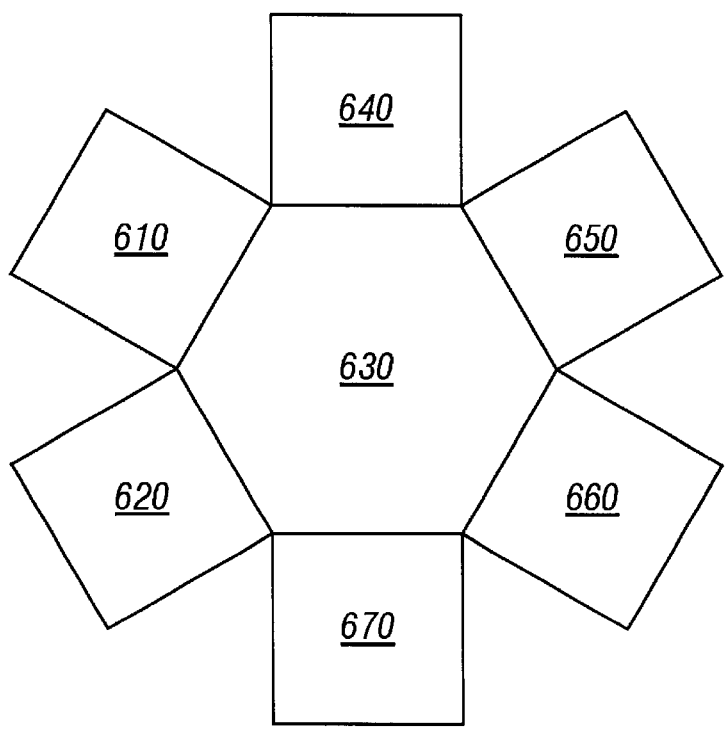
FIG. 9 is a schematic structural diagram of a multi-chamber type etching system of a sixth embodiment.

FIG. 9 shows a schematic structure of an application to a multi-chamber, wherein a shape of a robot chamber 630 is hexagonal. It comprises a loading chamber 610, an unloading chamber 620, the robot chambers 630, an etching chamber 640, an ashing chamber 650, a treatment chamber 660 and film forming chamber 670. Each of the chambers is connected via a gate valve which can close/open communication with the other chamber.

In the present embodiment, a process of patterning source and drain electrodes of a bottom gate type TFT with etching stopper SiNx on a glass substrate of 500 mm sq., of performing a hydrogen treatment and of forming a-SiNx film in the end as a protecting film was carried out.

The substrate set in the loading chamber 610 was conveyed to the etching chamber 640 by a robot in the robot chamber 630. In the etching chamber 640 where there is the inventive etching system equipped with the agitating electric field system, Al which is the source and drain electrodes was etched by using the reactive gas of $SiCl_4$, $Cl_2$ and $BCl_3$. The etching conditions were set conforming to those of the third embodiment. After etching Al, an n-type a-Si under Al was continuously etched by using $SF_6$ and $Cl_2$ gases and setting the conditions conforming to those of the second embodiment.

After etching, the substrate was conveyed to the ashing chamber 650 to ash and remove photoresist by oxygen plasma. Although the inventive system comprising the agitating electric field system might be used for the ashing, a normal parallel plate plasma reaction system was used because all the photoresist on the whole surface just needs to be removed.

After ashing, the substrate was conveyed to the treatment chamber 660 to perform sputter cleaning by Ar or the like when there exists residue of the photoresist or to perform plasma hydrogen treatment immediately when there is no residue. The hydrogen treatment was performed with conditions of 100 to 250° C. of substrate temperature, 200 to 800 SCCM of hydrogen and 0.2 to 0.8 W/cm² of RF power. It was effective to use the inventive agitating electric field system for the hydrogen treatment and because it was a single system gas in particular, a low frequency power source was effective to use as the agitating power source. Each of the phase shifters was controlled so that a phase of neighboring electrodes is shifted by 60° each and the function generator was operated in 1 KHz. A power of the agitating power source was 0.5 W/cm². It was found here that it is effective to comprise the agitating electric field system also in the process other than etching.

After finishing the treatment in the treatment chamber 660, the substrate was conveyed to the film forming chamber 670 by the robot in the robot chamber 630. SiNx is formed as a protecting film in the film forming chamber 670. Film forming conditions were 200 to 250° C. of substrate temperature, $SiH_4/NH_3/N_2=1/5/20$, 500 to 1500 SCCM of total flow amount and 0.5 to 1.0 W/cm² of RF power. It was also effective to use the inventive agitating electric field system in the film forming chamber 670 and the RF generator was effective as the agitating power source. Each of the phase shifters was controlled so that a phase of neighboring electrodes is shifted by 60° each and the function generator was operated in 5 MHz. A power of the agitating power source was 0.5 W/cm$^2$. It was found here that it is effective to comprise the agitating electric field system also in the process other than etching. The substrate was conveyed to the unloading chamber 620 after forming the film.

As it is apparent from the above description, the uniformity of the etching rate is improved for a substrate of 8 inches or more by having the agitating electric field system in the RIE type etching system as compared to the case without it. With the increase of size of the system, it can give a manufacturing margin with respect to precision control of gas flow in the system, thus allowing to create a small and light-weight system having a high maintainability. It can be also readily applied to a multi-chamber system. The same effect can be obtained in plasma treatments other than etching by having the agitating electric field system.

While preferred embodiments have been described, variations thereto will occur to those skilled in the art within the scope of the present inventive concepts which are delineated by the following claims.

What is claimed is:

1. A method for plasma-etching a thin film over a substrate, said method comprising:

introducing said substrate into a reaction chamber;

forming a plasma reaction space in said reaction chamber;

introducing an etching gas into said plasma reaction space;

applying an agitating electric field into said plasma reaction space in a direction parallel to a surface of said substrate; and applying an agitating magnetic field into said plasma reaction space in a direction parallel to a surface of said substrate.

2. A method according to claim 1, wherein plasma density for said plasma-etching is made uniform in the entirety of the surface of said substrate by said agitating electric field and said magnetic field.

3. A method according to claim 1, wherein said etching gas is selected from the group consisting of SiCl$_4$, Cl$_2$, BCl$_3$ and the mixture thereof.

4. A method for plasma-etching a thin film over a substrate of more than 8 inches in diameter or forming a rectangle having a size of 200 mm or more on each side thereof, said method comprising:

introducing said substrate into a reaction chamber;

forming a plasma reaction space in said reaction chamber;

introducing an etching gas into said plasma reaction space;

applying an agitating electric field into said plasma reaction space in a direction parallel to said substrate; and applying an agitating magnetic field into said plasma reaction space in a direction parallel to said substrate.

5. A method according to claim 4, wherein plasma density for said plasma-etching is made uniform in the entirety of the surface of said substrate by said agitating electric field and said magnetic field.

6. A method according to claim 4, wherein said etching gas is selected from the group consisting of SICl$_4$, Cl$_2$, BCl$_3$ and the mixture thereof.

7. A method for plasma-etching a thin film over a substrate, said method comprising:

introducing said substrate into a reaction chamber;

forming a plasma reaction space in said reaction chamber;

introducing an etching gas into said plasma reaction space;

applying an agitating electric field into said plasma reaction space in a direction parallel to said substrate; and applying an agitating magnetic field into said plasma reaction space in a direction parallel to said substrate;

wherein said agitating electric field is generated by two or more electrodes disposed around said plasma reaction space.

8. A method according to claim 7, wherein plasma density for said plasma-etching is made uniform in the entirety of the surface of said substrate by said agitating electric field and said magnetic field.

9. A method according to claim 7, wherein said etching gas is selected from the group consisting of SiCl$_4$, Cl$_2$, BCl$_3$ and the mixture thereof.

10. A method for plasma-etching a thin film over a substrate, said method comprising:

introducing said substrate into a reaction chamber;

forming a plasma reaction space in said reaction chamber;

introducing an etching gas into said plasma reaction space;

applying an agitating electric field into said plasma reaction space in a direction parallel to said substrate; and applying an agitating magnetic field into said plasma reaction space in a direction parallel to said substrate;

wherein said agitating magnetic field is generated by two or more magnets disposed around said plasma reaction space.

11. A method according to claim 10, wherein plasma density for said plasma-etching is made uniform in the entirety of the surface of said substrate by said agitating electric field and said magnetic field.

12. A method according to claim 10, wherein said etching gas is selected from the group consisting of SiCl$_4$, Cl$_2$, BCl$_3$ and the mixture thereof.

13. A method for plasma-etching a thin film over a substrate, said method comprising:

introducing said substrate into a reaction chamber;

forming a plasma reaction space in said reaction chamber;

introducing an etching gas into said plasma reaction space;

applying an agitating electric field into said plasma reaction space in a direction parallel to said substrate; and applying an agitating magnetic field into said plasma reaction space in a direction parallel to said substrate;

wherein said electric field is agitated by phase control of two or more electrodes disposed around said plasma reaction space;

wherein said magnetic field is agitated by phase control of two or more magnets disposed around said plasma reaction space.

14. A method according to claim 13, wherein plasma density for said plasma-etching is made uniform in the entirety of the surface of said substrate by said agitating electric field and said magnetic field.

15. A method according to claim 13, wherein said etching gas is selected from the group consisting of SiCl$_4$, Cl$_2$, BCl$_3$ and the mixture thereof.

16. A method of plasma-etching a thin film over a substrate of more than 8 inches in diameter or forming a rectangle having a size of 200 mm or more on each side thereof, said method comprising:

introducing said substrate into a reaction chamber;

forming a plasma reaction space in said reaction chamber;

introducing an etching gas into said plasma reaction space;

applying an agitating electric field into said plasma reaction space in a direction parallel to said substrate; and applying an agitating magnetic field into said plasma reaction space in a direction parallel to said substrate;

wherein said agitating electric field is generated by two or more electrodes disposed around said plasma space, wherein said agitating magnetic field is generated by two or more magnets disposed around said plasma reaction space.

17. A method according to claim 16, wherein plasma density for said plasma-etching is made uniform in the entirety of a surface of said substrate by said agitating electric field and said magnetic field.

18. A method according to claim 16, wherein said etching gas is selected from the group consisting of $SiCl_4$, $Cl_2$, $BCl_3$ and the mixture thereof.

* * * * *